(12) United States Patent
Russell

(10) Patent No.: US 7,766,667 B2
(45) Date of Patent: Aug. 3, 2010

(54) SEPARABLE ELECTRICAL CONNECTORS USING ISOTROPIC CONDUCTIVE ELASTOMER INTERCONNECT MEDIUM

(76) Inventor: James V. Russell, 232 Johnson Rd., Whitehouse Station, NJ (US) 08889

( * ) Notice: Subject to any disclaimer, the term of this patent is extended or adjusted under 35 U.S.C. 154(b) by 0 days.

(21) Appl. No.: 12/316,677

(22) Filed: Dec. 16, 2008

(65) Prior Publication Data

US 2009/0156029 A1      Jun. 18, 2009

Related U.S. Application Data

(60) Provisional application No. 61/008,262, filed on Dec. 18, 2007, provisional application No. 61/009,272, filed on Dec. 27, 2007.

(51) Int. Cl.
*H01R 9/09* (2006.01)

(52) U.S. Cl. .......................... 439/66; 439/74; 439/886; 439/86; 439/91

(58) Field of Classification Search .................. 439/66, 439/74, 886, 86, 91
See application file for complete search history.

(56) References Cited

U.S. PATENT DOCUMENTS

| | | | | |
|---|---|---|---|---|
| 6,020,629 | A * | 2/2000 | Farnworth et al. | 257/686 |
| 6,230,400 | B1 * | 5/2001 | Tzanavaras et al. | 29/840 |
| 6,271,056 | B1 * | 8/2001 | Farnworth et al. | 438/106 |
| 6,702,587 | B2 | 3/2004 | Weiss et al. | 439/66 |
| 6,854,985 | B1 * | 2/2005 | Weiss | 439/91 |
| 2004/0191955 | A1 * | 9/2004 | Joshi et al. | 438/106 |
| 2005/0012225 | A1 * | 1/2005 | Choi et al. | 257/782 |
| 2009/0111219 | A1 * | 4/2009 | Choi et al. | 438/119 |

* cited by examiner

*Primary Examiner*—Gary F. Paumen
(74) *Attorney, Agent, or Firm*—Richard B. Klar, Esq.; Law Office Richard B. Klar

(57) ABSTRACT

An electrical connector using an isotropic conductive elastomer as the interconnect medium.

13 Claims, 6 Drawing Sheets

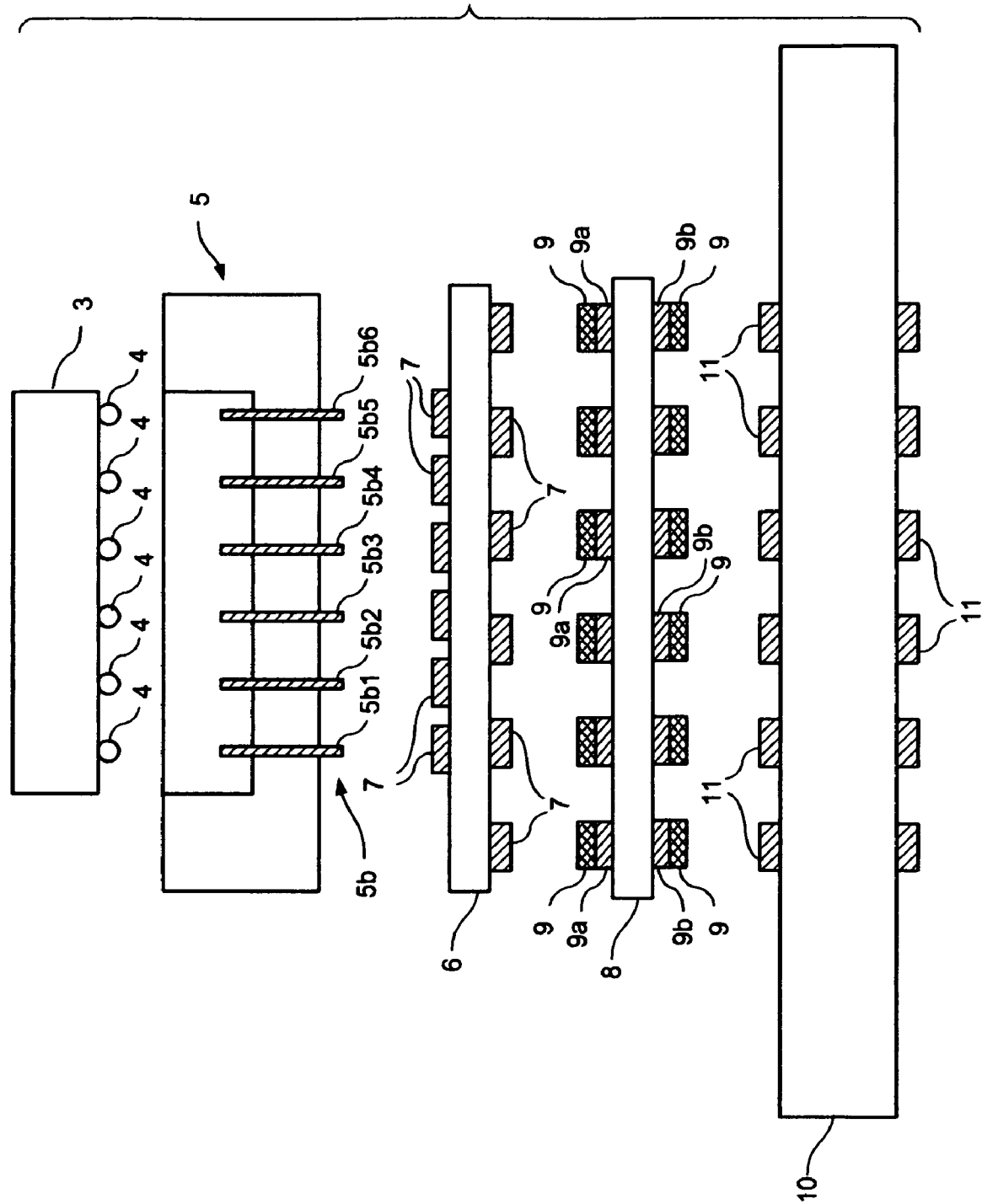

SEPARABLE ELECTRICAL CONNECTORS USING ISOTROPIC CONDUCTIVE ELASTOMER INTERCONNECT MEDIUM

This is a non-provisional application of provisional application Ser. No. 61/008,262 filed on Dec. 18, 2007 By James Russell and of provisional application Ser. No. 61/009,272 filed on Dec. 27, 2007 by James Russell.

BACKGROUND OF THE INVENTION

1. Field

The present invention relates to an electrical connector. These connectors electrically connect an adaptor board to a main circuit board (main board) where it is necessary to convert the coarse pad arrangement of one with a fine pad arrangement of the other through the use of an interposer board. In particular, the present invention relates to an electrical connector using isotropic conductive elastomers on both sides of a modified printed circuit (PC) board to ensure good electrical contact while freeing the PC board for the ability to route traces on the interface sides of the PC board.

2. The Related Art

U.S. Pat. No. 6,702,587 to Weiss et al. (the '587 patent) relates to an electrical connector using an anisotropic conductive elastomer (ACE). The ACE is provided in sheet form and conducts electricity in the z axis on a consistent pitch over the entire surface of the conducting region. This prevents the device in the '587 patent from having the ability to route conducting traces on the interface sides of the adaptor board and the main board.

SUMMARY

The present invention provides an electrical connector using an isotropic conductive elastomer as the interconnect medium. The isotropic material is preferably placed on conductive lands of both sides of a modified PC board to permit routing of conducting traces on the interface sides of the adaptor board and the main board.

BRIEF DESCRIPTION OF THE DRAWINGS

FIG. 1 is an exploded sectional view of a first embodiment of the present invention;

FIG. 4 is a third embodiment of the present invention in which there is no need for a modified PC board and the adaptor board has lands that are coated with isotropic elastomeric material; and.

DETAILED DESCRIPTION OF THE PREFERRED EMBODIMENT(S)

Figure 2A:
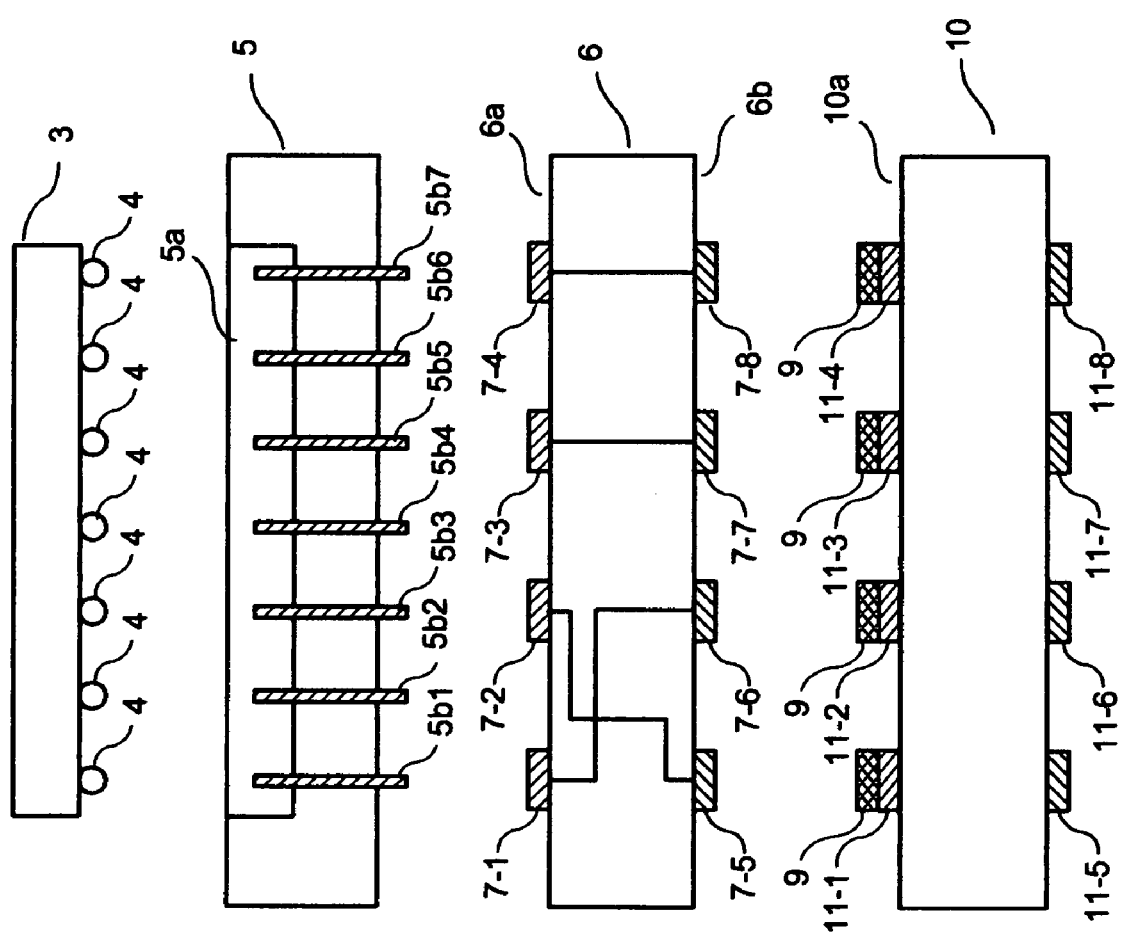
FIG. 2A is an exploded sectional view of a second embodiment of the present invention in which the number of pads is different from that of the embodiments in FIGS. 1, 4 and 5.
Figure 2B:
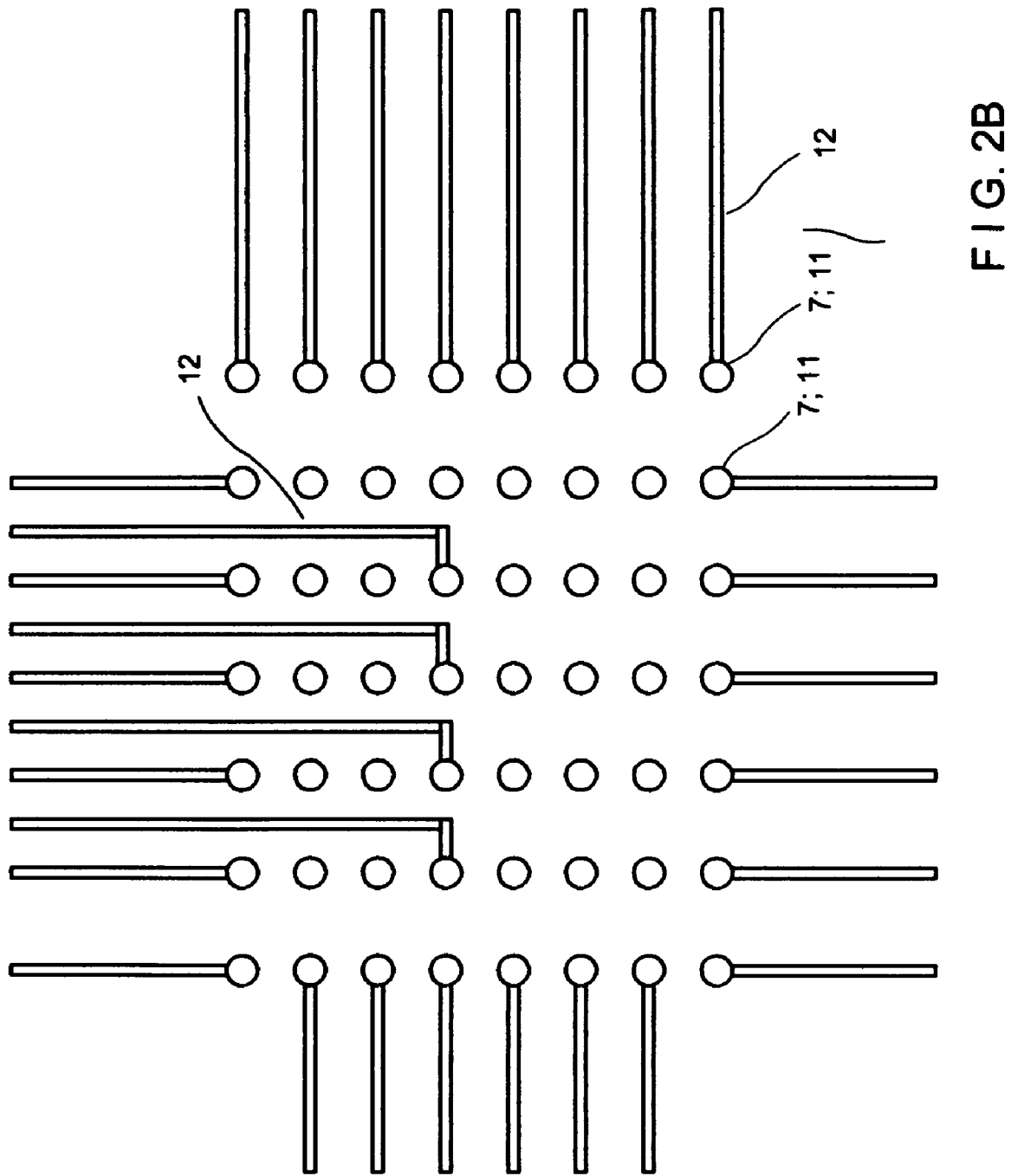
FIG. 2B illustrates the trace routing where the trace routing is possible on the interface layers of the adaptor board, it being understood that although not shown the trace routing can be similarly effected on the interface layers of the main circuit board instead of the adaptor board; in accordance with the embodiments of FIG. 1, FIG. 4 and FIG. 5 of the present invention.
Figure 3:
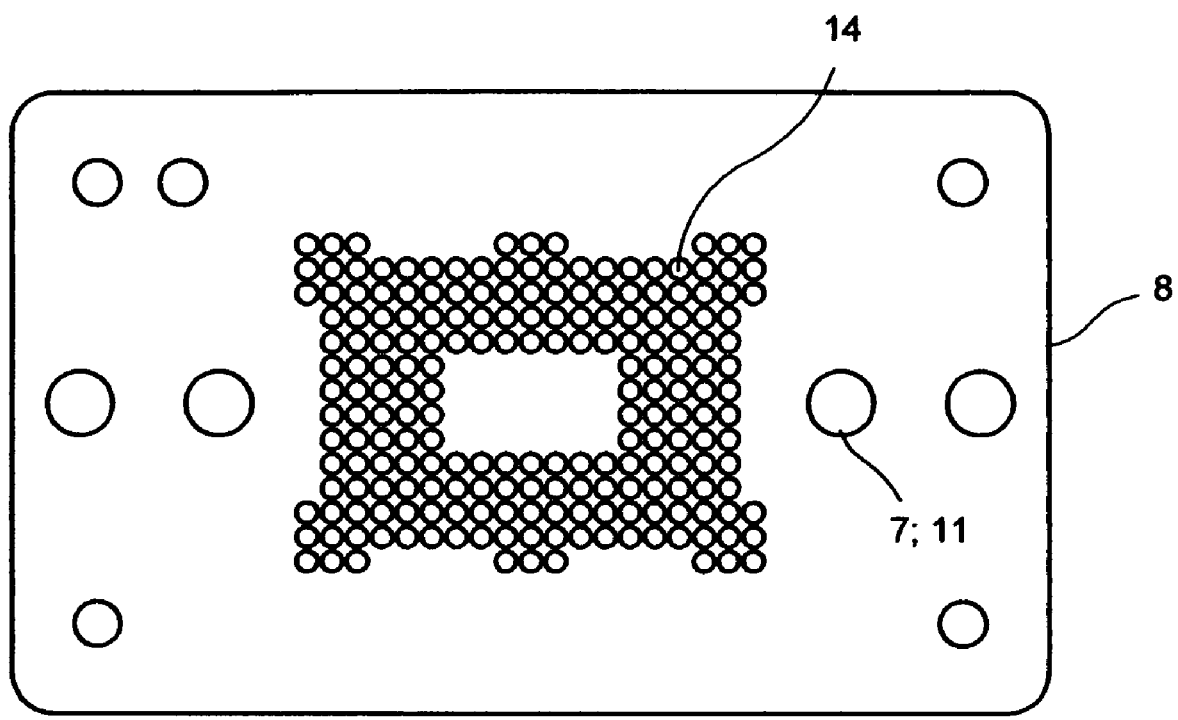
FIG. 3 is the modified PC board of the embodiment of FIG. 1.

Referring now to the drawings of FIGS. 1-3, FIG. 1 illustrates the electrical connector of the present invention in which the connector has a mechanical compression structure 5, an adaptor board 6 with connecting lands or pads 7, and a modified PC board 8 with isotropic elastomer material formed on lands on both sides of the PC board 8; and a main circuit board 10 having connecting lands 11. A socket 5a in the compression structure 5 is adapted to house a test circuit such as an integrated circuit (IC) chip. Pins 5b provided for making electrical connections in the IC chip housed in socket 5a with pads 7 of the adaptor board 6. The connecting lands or pads 7 of the adaptor board 6 and of the connecting lands 11 of the main circuit board 10 are placed into contact with isotropic elastomer material 9 located on the lands or pads 9a of the modified PC board 8 when the adaptor board 6 and the PC board 8 and the main circuit board are compressed together by the mechanical compression structure. The connecting pads. Thus the modified PC board 8 by placement of the isotropic elastomeric material 9 thereon serves as an isotropic pad defined connector 8.

By compressing the boards together it is possible to provide an electrical connection between the adaptor board and the main circuit board 10 and convert the pads on each board's surface connection from coarse to fine or vice verse by use of the intermediate connector—the modified PC board with isotropic elastomer. By using lands on both sides of the PC board the connection is good while increasing the routing densities and deceasing cost by only placing isotropic materials at pad locations rather than throughout the entire surface of the connecting region as with the '587 patent.

In addition to converting the pitch by connecting fine pads to coarse pads and vice verse, the present invention also provides for rerouting the electrical connections from the pins 5b1-7 connected to the pins 4 of the test circuit 3 (such as an IC chip 3) housed in the socket 5a of the mechanical compression structure 5 to the pads 7 of the adaptor board 6 and to the pads 11 of the main circuit board 10 As shown in FIG. 2A, the adaptor board 6 can be rerouted so that its path or traces 12 do not have to connect to the corresponding land or pad 11 on the main circuit board 10 nor does it need to translate pitch. Thus pin 5b-1 on structure 5 can be connected to one pad 7-1 on a first side 6a of the adaptor board 6 and pad 7-1 is rerouted via a trace 12 to connect to the pad 74 rather than the first land 7-5 on a second side 6b of the adaptor board 6. The pad 7-2 is then connected to the pad 11-2 on the opposing surface 10a of the main circuit board 10. Any possible re-routing can be effected in this way. In this way the present invention permits re-routing of circuitry as desired. In addition the numbers of pads for the adaptor board 6 and for the main circuit board 10 can vary as needed and are different for this embodiment than for the embodiment in FIG. 1. In addition in this embodiment of FIG. 2A there is no need for a modified PC board 8 as in FIG. 1 as is also the case in the embodiment of FIG. 5.

FIG. 2B illustrates one possible illustration of an enhanced trace routing 12 of the present invention. As a result of the placement of the isotropic lands 9 on each side of the modified PC board 8 trace routing 12 is possible in and around connecting land arrays on interface layers between the modified PC board 8 and the adaptor board 6 and between the modified PC board 8 and the main circuit board 10. This provides for routing density in circuit on both sides of the modified PC board 8 of the present invention. In addition this provides a more cost effective solution than the aforementioned prior art proposal. The modified PC board is not shown in the illustration of FIG. 2A. It is understood that this feature of the re-routing of the adaptor board 6 works for the embodiments of FIGS. 1, 4 and 5.

FIG. 3 illustrates the modified PC board 8. The PC board 8 is modified by placing lands with isotropic material on both surfaces of the PC board 8 as shown. While FIG. 3 shows one surface it is understood that the other surface is similarly arranged. The isotropic material can be isotropic paste placed on pads of the pads on both sides of the modified PC board 6

Figure 4:
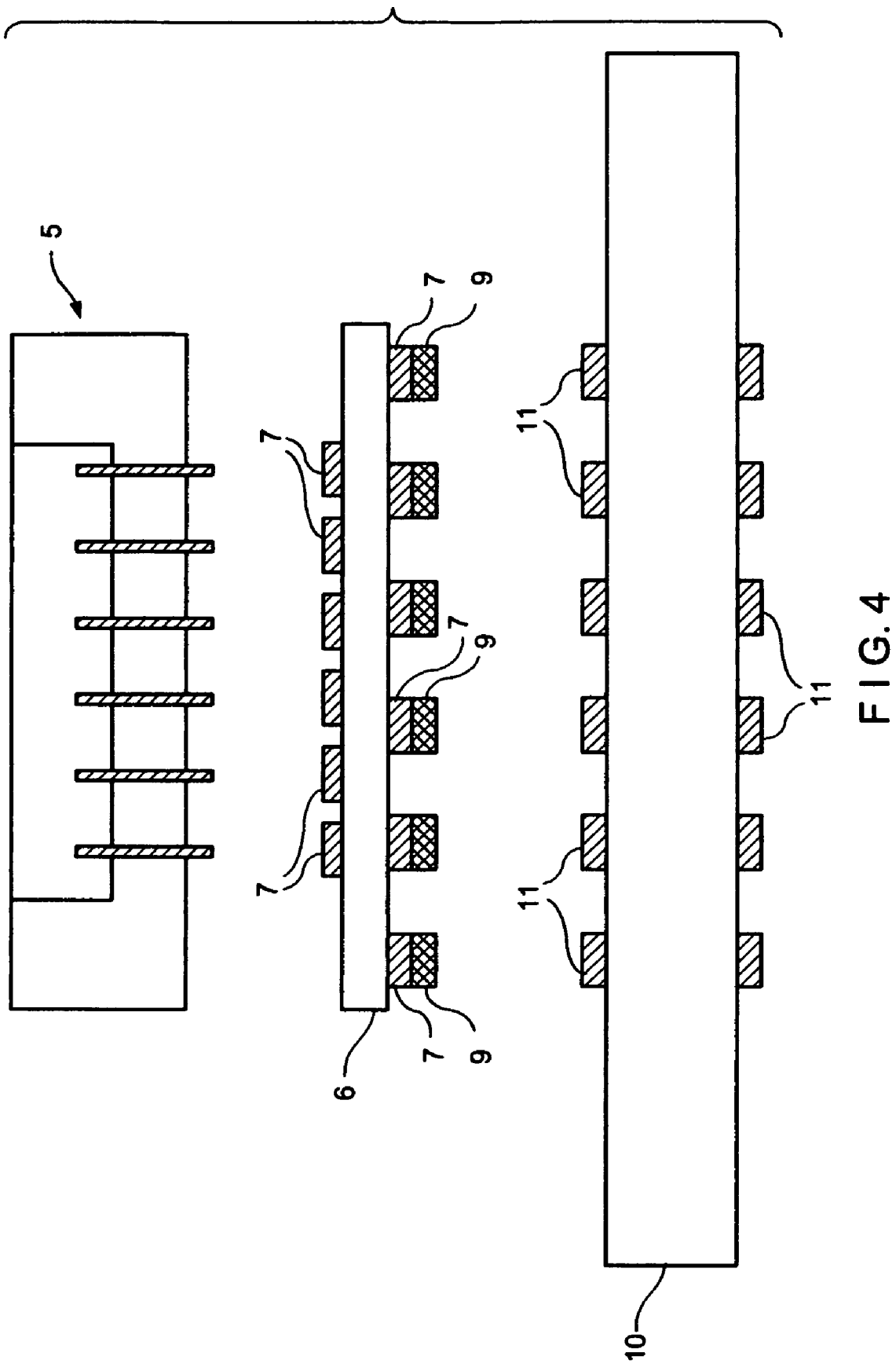

FIG. 4 illustrates a second embodiment in which there is no need for a modified pc board between the adaptor board and the main circuit board. Instead the lands on the surface of the adaptor board opposingly facing the lands of the main circuit board are coated with an isotropic elastomer material such as isotropic elastomer paste. Thus instead of coating the pads of a modified PC board 8, as was the case in FIG. 1 of the present disclosure, the lands of the adaptor board 6 facing the lands of the main circuit board 10 are coated with the isotropic elastomer paste.

Figure 5:
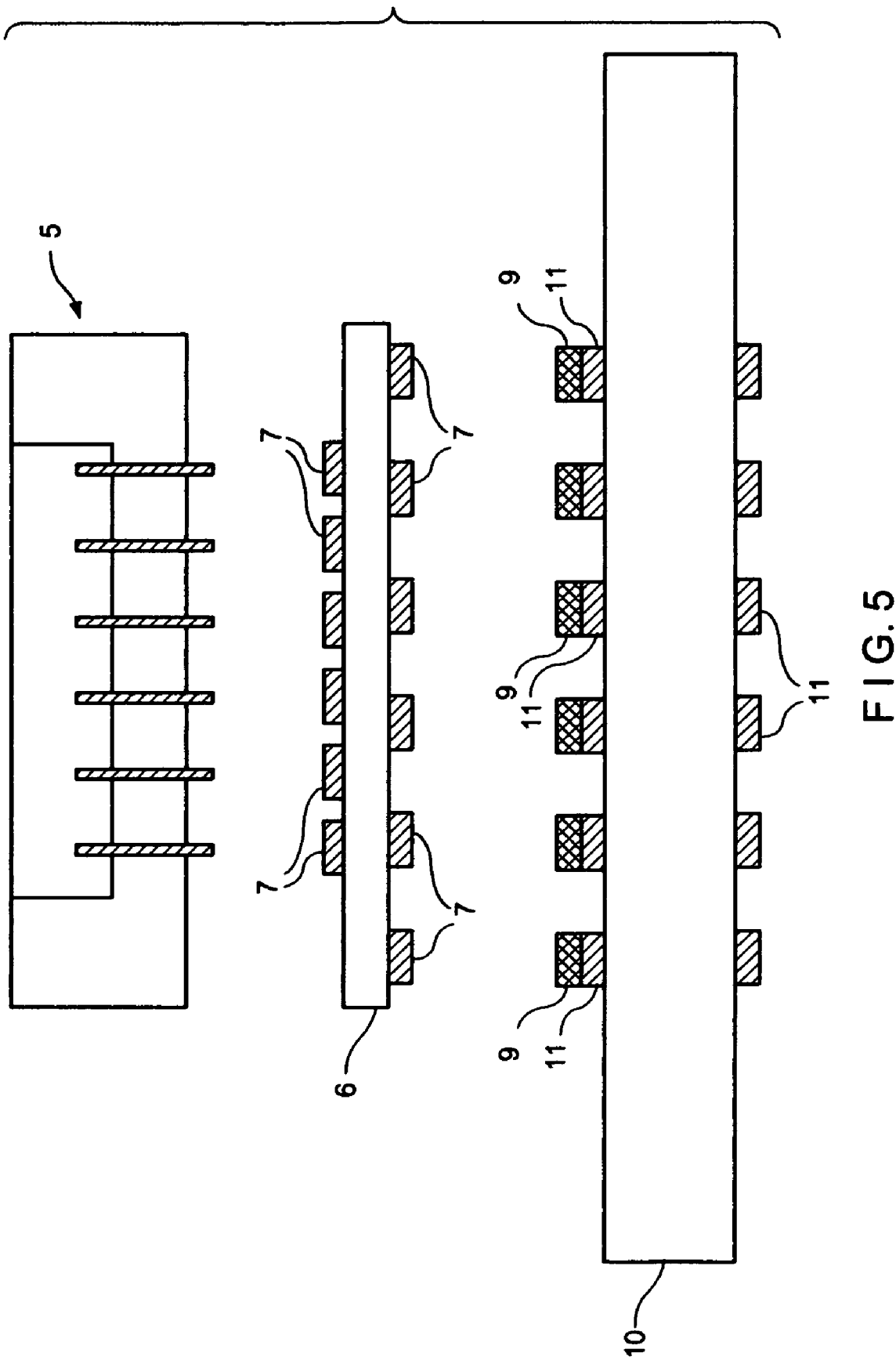
FIG. 5 is a fourth embodiment of the present invention in which there is no need for a modified PC board and the main circuit board has lands that are coated with isotropic elastomeric material.

FIG. 5 illustrates a third embodiment in which there is no need for a modified PC board 8 between the adaptor board 6 and the main circuit board 10. Instead the lands on the surface of the main circuit board 10 opposingly facing the lands of the adaptor board 6 are coated with an isotropic elastomer material such as isotropic elastomer paste. Thus instead of coasting the lands of a modified PC board 6, as was the case in FIG. 1 of the present disclosure, the lands of the main circuit board 10 facing the lands of the adaptor board 6 are coated with the isotropic elastomer paste.

FIG. 2B illustrates one possible illustration of an enhanced trace routing 12 of the embodiments of FIGS. 4 and 5 of the present invention as it has illustrated for the embodiment of FIG. 1. Pads can be 7 or 11 depending upon where the isotropic paste placed. Therefore is the isotropic material such as isotropic paste is placed on the pads 7 of the adaptor board 6 then trace re-routing must be done on the main circuit board 10 as described previously with respect to the adaptor board 6. Similarly, if the isotropic material such as isotropic paste is placed on the pads 11 of the main circuit board 10 then trace rerouting must be done on the adaptor board 6.

While presently preferred embodiments have been described for the purposes of the disclosure, it is understood that numerous changes in the arrangement of apparatus parts can be made by those skilled in the art. Such changes are encompassed within the spirit of the invention as defined by the appended claims.

The invention claimed is:

1. An electrical connector for providing an electrical connection between an adaptor board and a main circuit board, comprising:
   an interconnect medium having an isotropic conductive elastomer that provides an electrical connection between said adaptor board and said main circuit board;
   a mechanical compression structure having a cavity in which a test circuit having pins is housed, said structure having pins for connecting to pads on said adaptor board to provide an electrical connection from the pins of the test circuit to said adaptor board and from said adaptor board to the electrical connector and from said electrical connector to said main circuit board.

2. The electrical connector of claim 1 wherein said interconnect medium is formed as a printed circuit board (PC) board disposed in between said adaptor board and said main circuit board so that said PC board has interface sides with said adaptor board and said main circuit board, said PC board being modified to have isotropic elastomers on both sides of said modified PC board to ensure good electrical contact while freeing said adaptor board and said main circuit board to route traces on interface sides of said adaptor board and said main circuit board.

3. The electrical connector of claim 1 wherein said electrical connector is formed as lands on a surface of said adaptor board opposingly facing lands of said main circuit board where said lands of said adaptor board are coated with an isotropic elastomer material.

4. The electrical connector of claim 3 wherein said isotropic elastomer material is an isotropic paste.

5. The electrical connector of claim 1 wherein said electrical connector is formed as lands on surface of said main circuit board opposingly facing lands of said adaptor board where said lands of said main circuit board are coated with an isotropic elastomer material.

6. The electrical connector of claim 3 wherein said isotropic elastomer material is an isotropic paste.

7. The electrical connector according to claim 1 wherein:
   electrical connections from pins of a test circuit are rerouted to the pads of the adaptor board and the pads of the main circuit board by rerouting the electrical connection from an upper surface of the pads on the adaptor board to pads of a bottom surface of the adaptor board.

8. The electrical connector according to claim 1 wherein electrical connections from the pins of a test circuit are rerouted to the pads of said adaptor board and the pads of said main circuit board by rerouting the electrical connection from an upper surface of the pads on said main circuit board to pads of a bottom surface of said main circuit board.

9. The electrical connector of claim 3 wherein said isotropic elastomer material is an isotropic paste.

10. The electrical connector according to claim 1 wherein electrical connections from pins of a test circuit are rerouted to the pads of the adaptor board and the pads of the main circuit board by rerouting the electrical connection from an upper surface of the pads on the adaptor board to pads of a bottom surface of the adaptor board.

11. The electrical connector according to claim 1 wherein electrical connections from the pins of a test circuit are rerouted to the pads of said adaptor board and the pads of said main circuit board by rerouting the electrical connection from an upper surface of the pads on said main circuit board to pads of a bottom surface of said main circuit board.

12. An electrical connector for providing an electrical connection between an adaptor board and a main circuit board, comprising:
   an interconnect medium having an isotropic conductive elastomer that provides an electrical connection between said adaptor board and said main circuit board and said electrical connector is formed as lands on a surface of said adaptor board opposingly facing lands of said main circuit board where said lands of said adaptor board are coated with an isotropic elastomer material.

13. The electrical connector of claim 12 wherein said isotropic elastomer material is an isotropic paste.

* * * * *